United States Patent [19]

Harrison

[11] Patent Number: 4,942,939

[45] Date of Patent: Jul. 24, 1990

[54] SPEAKER SYSTEM WITH FOLDED AUDIO TRANSMISSION PASSAGE

[76] Inventor: Stanley N. Harrison, 6466 E. Ponderosa Dr., Parker, Colo. 80134

[21] Appl. No.: 353,540

[22] Filed: May 18, 1989

[51] Int. Cl.[5] ................................................ H05K 5/00

[52] U.S. Cl. .................................... 181/156; 181/145; 181/150; 181/154; 181/155; 181/199; 381/90; 381/154

[58] Field of Search ............... 181/145, 152, 154, 155, 181/156, 199, 144, 150; 381/90, 154, 160

[56] References Cited

U.S. PATENT DOCUMENTS

| | | | |
|---|---|---|---|
| 2,031,500 | 2/1936 | Olney . | |
| 2,224,919 | 12/1940 | Olson . | |
| 2,550,336 | 4/1951 | Daniel | 181/154 |
| 2,646,852 | 7/1953 | Forrester | 181/156 |
| 2,808,121 | 10/1957 | Goettner | 181/145 |
| 3,529,691 | 9/1970 | Wesemann | 181/156 |
| 3,923,124 | 12/1975 | Hancock | 181/156 |
| 4,168,761 | 9/1979 | Pappanikolaou | 181/156 |
| 4,173,266 | 11/1979 | Pizer et al. | 181/156 |
| 4,593,784 | 6/1986 | Flanders | 181/144 |
| 4,628,528 | 12/1986 | Bose et al. | 381/90 |
| 4,790,408 | 12/1988 | Adair | 181/152 |
| 4,853,964 | 8/1989 | Weckler | 181/152 X |

FOREIGN PATENT DOCUMENTS

| | | | |
|---|---|---|---|
| 2608068 | 9/1977 | Fed. Rep. of Germany | 181/156 |
| 0004817 | 1/1977 | Japan | 181/156 |
| 337264 | 10/1930 | United Kingdom | 181/156 |

*Primary Examiner*—Benjamin R. Fuller
*Attorney, Agent, or Firm*—John E. Reilly

[57] ABSTRACT

A loudspeaker cabinet in which an elongated enclosure has a driver mounted internally in one wall thereof in facing, open communication with the exterior of the enclosure and an outlet sound port positioned in spaced relation to the driver in another wall of the enclosure remote from the one wall. An audio transmission passage extends longitudinally at right angles to the axis of the driver and is defined by baffles extending in equally spaced parallel relation to one another to divide the passage into a plurality of, communicating folded passage sections extending from open communication with the driver to terminate in the outlet sound port. The total length of the passage through its cross-sectional area is on the order of from 8:1 to 16:1 so that at low frequencies air pulses delivered by the driver will remain in phase throughout the length of the transmission passage.

17 Claims, 2 Drawing Sheets

SPEAKER SYSTEM WITH FOLDED AUDIO TRANSMISSION PASSAGE

This invention relates to sound reproducing systems, and more particularly relates to a novel and improved speaker enclosure having a folded elongated tubular audio transmission passage for enhanced performance.

BACKGROUND AND FIELD OF THE INVENTION

Numerous speaker systems have been devised to the end of improving the bass or low frequency response of the system, principally in the range of 16 to 100 Hz. Nevertheless, the conventional types of speaker enclosures suffer from various drawbacks. For example, those that employ a flat baffle or panel to which the driver is mounted tend to cause cavity resonance and distortion of the sound. Also such systems require a large baffle area for good low frequency response. In open-backed cabinets in which the driver is mounted on a front panel the speaker effectively has a large diameter-to-length ratio and is inefficient, causes resonant peaks and requires a relatively large cabinet area for a low bass or frequency response. Similarly, a closed cabinet in which the speaker is again mounted on a panel at the rear of the cabinet requires a large diameter-to-length ratio but is nevertheless inefficient, and requires a larger cabinet volume for low frequency response. Nevertheless, it does achieve a flatter response and good damping.

In those cabinets that are ported or provided with a side or front opening so that the speaker is effectively an open tube, the efficiency is improved and requires less cabinet volume for low frequency response.

Labyrinth type enclosures have been proposed in the past in an effort to overcome the deficiencies in low frequency response. For example, U.S. Pat. No. 2,031,500 to Olney couples the back of the speaker cone to the end of a conduit which is folded within a cabinet that places major emphasis on the sound absorbing qualities of the conduit. U.S. Pat. No. 4,628,528 to Bose et al discloses dual folded tubular arrangements between a speaker and opening, the tubes being formed by staggered internal baffles and essentially requires that the pressure wave transmission lines defined by the tubes have an effective length substantially equal to a quarter wave length at the lowest frequency and effectively requires separate transmission lines or passages.

U.S. Pat. No. 4,168,761 to Pappanikolaou is directed more to a labyrinth type speaker enclosure which can maintain free air resonant frequency of a speaker and has a large total internal surface area compared to its volume. It is specifically concerned with providing numerous spaced internal partitions for back waves generated by the speaker and to break them up into substantially annular shape. Another U.S. Letters Patent of interest is that to Olson No. 2,224,919 which discloses the use of dual folded tubes extending from opposite sides of the speaker cone. Pat. Nos. 3,923,124 to Hancock and 4,173,266 to Piser, et al. disclose modified types of folded tube arrangements as do U.S. Pat. Nos. 3,529,691 and 2,646,852 to Wesemann and Forrester respectively.

The present invention overcomes a number of drawbacks and disadvantages in prior art speaker systems in providing for an enclosure containing an audio transmission passage so constructed as to avoid any phase shift in the low frequency range, is extremely compact and readily conformable for use in various sizes and styles of speaker systems and enclosures. The audio transmission passage design of the present invention further lends itself well to compact low profile systems, including portable systems and is further adaptable for use with a bass driver alone or in combination with mid-range and tweeter components. No particular separation or spacing is required between the driver opening and port opening and in general distortion is eliminated even with long excursions.

SUMMARY OF THE INVENTION

Accordingly, it is an object of the present invention to provide for a novel and improved speaker cabinet which is conformable for use with a bass system alone or in combination with a midrange and tweeter.

It is another object of the present invention to provide for a novel and improved speaker cabinet characterized by having a single amplifying acoustic transmission passage which is folded into the smallest possible space and obviates separate transmission passages or lines.

A further object of the present invention is to provide for a novel and improved speaker cabinet which is so designed in combination with a driver as to eliminate distortion even with long excursions of the cone or driver at the lower frequencies while maintaining the same pulse relationship between the driver and outlet port.

A further object of the present invention is to provide in a speaker cabinet for a novel and improved audio transmission passage which has a length corresponding to one-quarter wavelength of the highest frequency up to levels of 250 Hz. and has no phase shift in the low frequency range.

A still further object of the present invention is to provide for a modular loudspeaker cabinet which can be employed with a bass system alone or in combination with a midrange and tweeter system by interchangeable mounting of one wall of the speaker; and further wherein the system is of rectangular design and lends itself well to ease of manufacture, does not require special electronics and has a novel heat sink arrangement which along with an amplifier section is cooled by the passage of air pulses through a sound port in one wall of the speaker adjacent to the heat sink.

In accordance with the present invention, there has been devised a loudspeaker cabinet in which an elongated enclosure has a driver or base element mounted internally of the enclosure in one wall thereof in facing, open communication with the exterior of the enclosure and an outlet sound port positioned in spaced relation to the driver element in another wall of the enclosure remote from the one wall. An audio transmission passage extends longitudinally of the enclosure at right angles to the axis of the driver element, the passage being defined by baffles extending in equally spaced parallel relation to one another within the enclosure to divide the passage into a plurality of communicating folded passage sections extending from open communication with the driver element internally of the enclosure to terminate in the outlet sound port.

The above and other objects, advantages and features of the present invention will become more readily appreciated and understood from a consideration of the following detailed description of preferred and modified forms of the present invention when taken together with the accompanying drawings in which:

DETAILED DESCRIPTION OF THE PREFERRED EMBODIMENT

Figure 1:
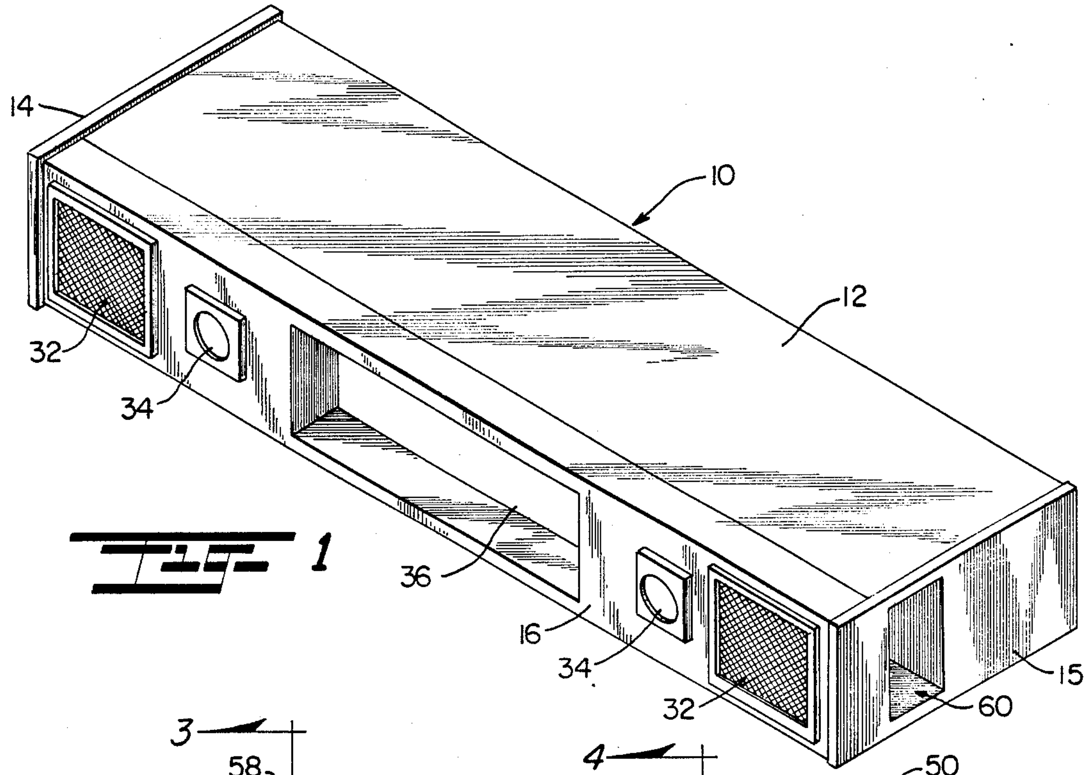
FIG. 1 is a perspective view of a preferred form of speaker cabinet in accordance with the present invention.
Figure 2:
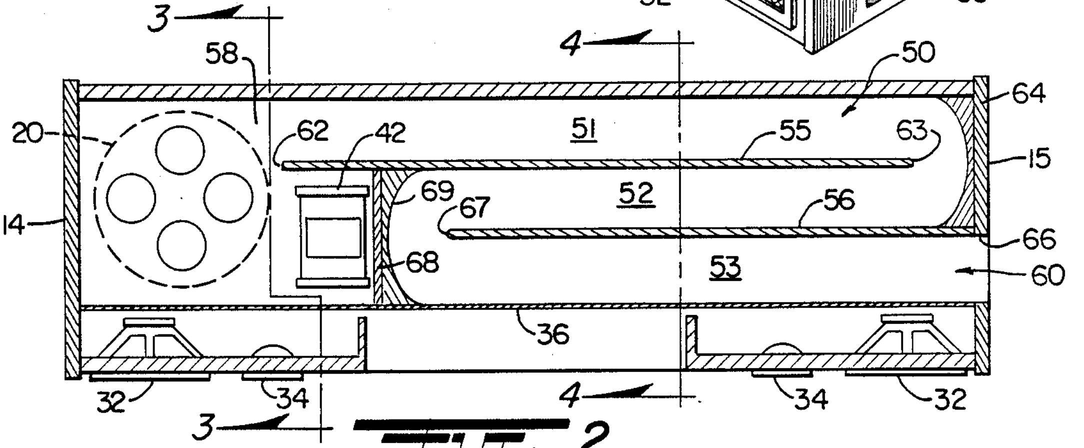
FIG. 2 is a longitudinal section view of the preferred form of speaker cabinet shown in FIG. 1.

Referring in detail to the drawings, FIGS. 1 to 4 illustrate a preferred form of stereo speaker unit 10 comprising an elongated, low profile speaker cabinet which is made up of a top wall 12, bottom wall 13, opposite end walls 14 and 15, and front and rear walls 16 and 17, respectively. A conventional driver component in the form of a woofer 20 is located at one end of the speaker housing in downwardly facing aligned relation to a woofer port or opening 22 in the bottom wall so that the diaphragm 24 Of the woofer is in open communication with the exterior of the cabinet. Suitable mounting screws 25 extend upwardly through the bottom wall 13 and through gasket 26 into connected relation to the outer peripheral edge of the cone or diaphragm 24 in order to fixedly attached the woofer in place within the enclosure.

Figure 3:
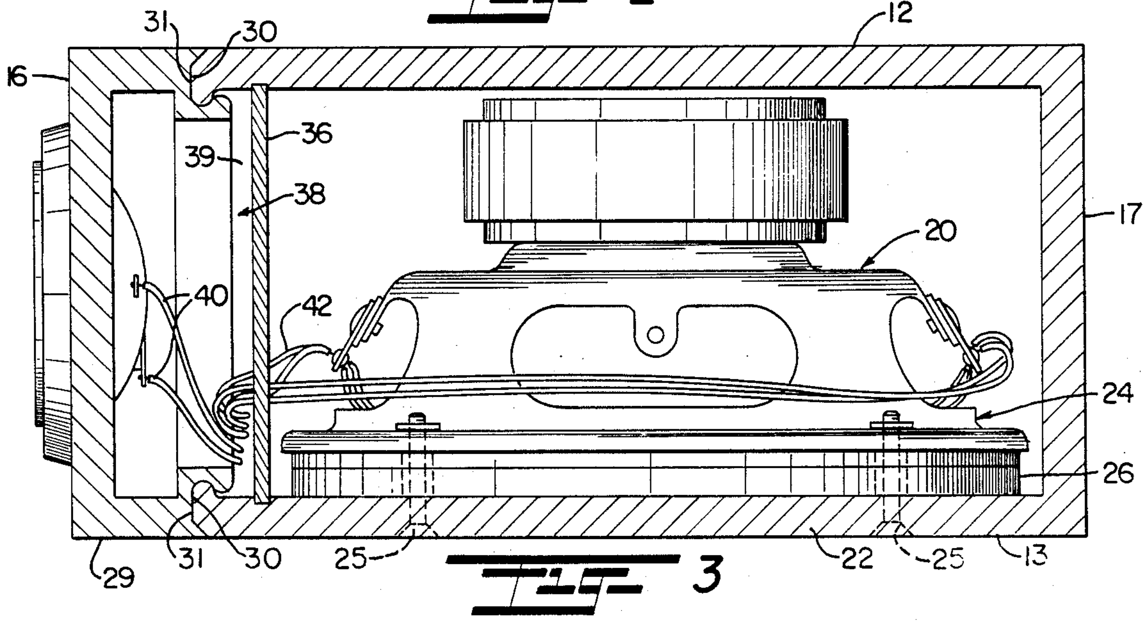
FIG. 3 is an enlarged cross-sectional view taken about lines 3—3 of FIG. 2.
Figure 4:
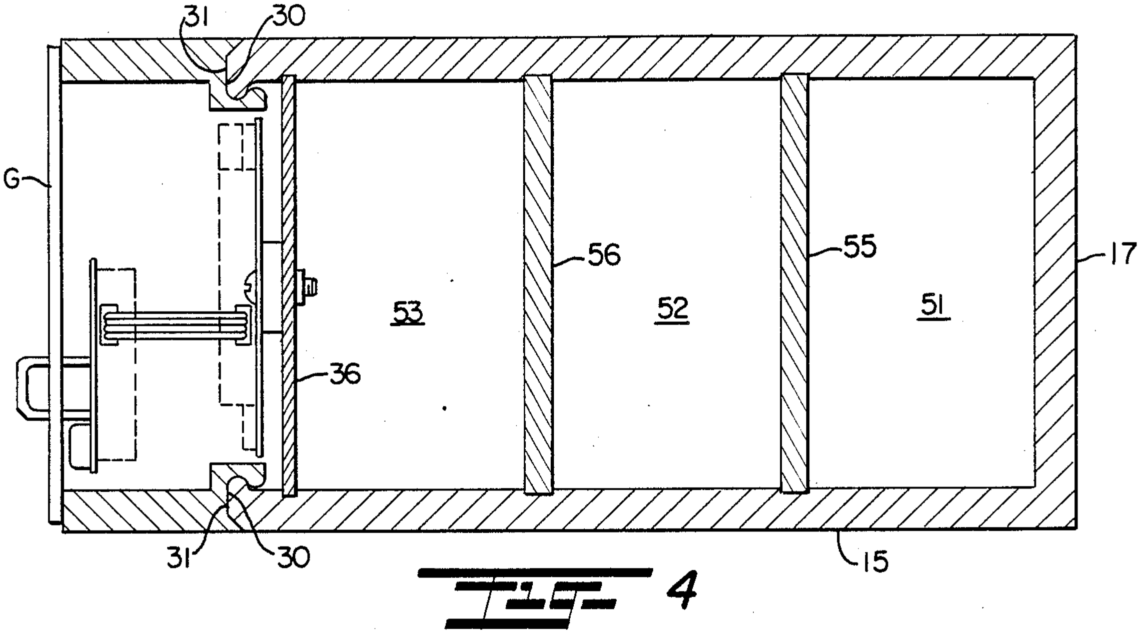
FIG. 4 is an enlarged cross-sectional view taken about lines 4—4 of FIG. 2.

As best seen from FIGS. 3 and 4, a modular front section is a one-piece extrusion made up of the front panel 16 and upper and lower rearward extensions 28 and 29, respectively, terminating in upper and lower attaching grooves 30. Grooves 30 are complementary to and slidable along attaching ribs 31 on the forward edges of the top and bottom walls 12 and 13. Mounted at opposite ends of the front panel 16 are a pair of midrange speakers 32, and tweeter components 34 are mounted directly adjacent to the midrange components. A recessed area 35 is provided in the front wall for insertion of a conventional receiver. The entire front section is isolated from the main body of the speaker enclosure by a heat sink 36 which is in the form of a vertically extending metal plate inserted into grooves internally of the top and bottom walls 12 and 13. An amplifier board 38 is mounted directly in front of the heat sink 36 and includes a cooling air passage 39. Speaker leads 40 extend forwardly from the amplifier board for connection into the midrange and tweeter components. Another set of speaker leads 42 extend rearwardly from the amplifier board through the heat sink 36 for connection to the woofer 20. Although not shown, the interior of the front section affords sufficient space for mounting of a conventional input PC board as well as input jacks and any other accessories needed for operation of the tuner or receiver. In this relation, a power supply 42 is mounted directly behind the heat sink 36 within the enclosure directly adjacent to the woofer 20.

In the modular construction of the preferred form of invention, preferably the front section is designed as shown so that the grooves 30 can be aligned with the ribs 31 and advanced in an endwise direction from one end of the enclosure until the front section is aligned with the main body of the enclosure. The end walls 14 and 15 are then mounted in position over the front section to complete the assembly of the module and can be permanently united by means of suitable bonding or mounting screws as desired.

An important feature of the present invention resides in the formation of an acoustical transmission passage as broadly designated at 50 which is divided into sections 51, 52 and 53 by longitudinally extending baffles 55 and 56. The baffles 55 and 56 extend vertically between the top and bottom walls 12 and 13 in spaced parallel relation to one another and are staggered to define an elongated folded but continuous passage extending from an entrance area 58 in open communication with the space surrounding the woofer unit 20 to a sound port 60 which is formed in the end wall 15 of the enclosure at the end opposite to that of the woofer unit 20. It will be noted that the baffle 55 extends the greater length of the enclosure or cabinet 10 from an end or edge 62 in spaced, adjacent relation to the woofer 20 to an opposite end 63 in spaced adjacent relation to the end wall 15. The spacing between the end 63 and end wall 15 corresponds to the spacing between the baffle 55 and the rear wall 17. In addition, a chamfered bend is formed at 64 along the interior surface of the wall 15 directly opposite to the end or edge 63. The baffle member 56 has one end 66 abutting the inner surface of the end wall 15 and opposite end 67 in adjacent, spaced relation to an end plate 68 which extends rearwardly from the heat sink 36 to an intermediate point on the baffle 55. The end plate 68 is chamfered as at 69 to form a rounded continuation of the passage from the intermediate section 52 into the forwardmost section 53. In addition, the edges 63 and 67 are rounded so as to minimize any turbulence created in the air pulses as they undergo reversal and flow between the passage sections 51, 52 and 53. Preferably, the surfaces of the baffles, 55 and 56 as well as the inner wall surfaces of the rear wall 17 and heat sink 36 are highly polished so as to minimize any friction when contacted by the air pulses and cooperate with the smooth edges 63 and 67 and the chamfered bends 64 and 69, respectively, to reduce turbulence in the airstream.

As illustrated, the preferred form of audio tranmission line or passage 50 is folded into the three tubular sections 51, 52 and 53 as described and has a rectanguar cross-section which is sized to produce a wavelength on the order of ¼ the highest frequency of the air pulses to be produced. For a rectangular passage, as best seen from FIG. 4, a typical width between the baffles and between the baffles and opposite walls would be on the order of 2 in. and with a height between the top wall 12 and bottom wall 13 on the order of 3.5 in. These dimensions will achieve a flat response of ±3 db in the frequency range of 16 Hz. to 250 Hz. The folded passage 50 will have an overall length of 5 ft. for a frequency range of 16 Hz. to 250 Hz. and 8 ft. in length for a range of 8 Hz. to 90 Hz. The displaced volume of air at the lowest frequency will essentially determine the cross-sectional area, since if the area is too small it will affect the air pulses and tend to cause turbulence in the passage 50. It has been found that the ratio of the total length of the transmission passage to the cross-sectional area of the passage is preferably on the order of 8:1 to 16:1 for a cross-sectional area in the range of 6 $in.^2$ to 8 $in.^2$. In this way, at low frequencies the air pulses delivered by the driver will remain in phase throughout the length of the transmission passage. It has been found also that the use of polished walls and smooth bends along the transmission passage will permit the reduction of the cross-sectional area from the 6 in.$^2$ to 8 in.$^2$ range for a given length of passage 50.

From the foregoing, in utilizing the folded passage 50 as described enables the construction of a very compact enclosure with excellent sound reproducing characteristics, especially for bass or sub-bass driver elements. The passage 50 is so arranged in relation to the heat sink 36 that the air pulses generated by the driver element 20 will perform limited cooling of the heat sink. Although not illustrated, the center section between the front panel 16 and the heat sink provides the necessary chamber or space for amplifiers, cross-over networks and the depth to accommodate an interchangeable front panel to permit utilization of different speaker systems in association with the bass driver element.

Most desirably, the air pulses are generated from the back of the speaker and caused to travel forwardly through the passage 50 and to exit through the port 60 directly adjacent to the interchangeable front panel section. The passage is so dimensioned as described that as the bass frequency is lowered, the driver and port air pulses become more in phase to correct for a normal low frequency roll-off. As the bass frequency rises towards a cross-over point of the driving amplifier where a normal response would boom or peak in volume intensity, the driver and port pulses shift in phase such that the net frequency response remains flat to the listener. In a single port, tubular passage 50 as illustrated and described wherein the end is open or ported, the total length of the sections may vary from 56 in. to 120 in. for a driver having a frequency range of 16 Hz. to 200 Hz; and the cross-sectional area is approximately 7 in.$^2$ but can vary from 5 in.$^2$ to 10 in.$^2$ in that frequency range. Furthermore, the dimension of the transmission passage 50 is such that the room characteristics will effect loading both of the driver end adjacent to the speaker 20 and the opposite port end 60 so that low frequency response in the room itself will enhance the aforementioned characteristics of the passage.

Furthermore, the enclosure or cabinet of the present invention lends itself well to multiple channel amplifiers having cross-overs ahead of the amplifier and the heat sink 36 forming a wall between the passage 50 and the front amplifier space. The modular construction of the cabinet and specifically the modular front end section which enables interchangeable mounting of different speaker/stereo components also lends to ease of access and replacement of components in the event of damage or servicing. In this regard, the total cabinet design lends itself especially well to extrusion or injection molded plastic as well as wood products.

Figure 5:
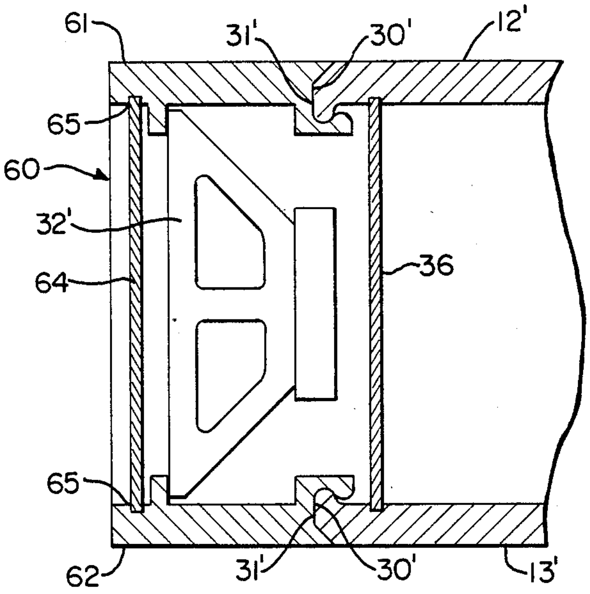
FIG. 5 is a cross-sectional view of a modified form of speaker cabinet in accordance with the present invention.

Although the woofer 20 has been described as mounted in open facing communication to the bottom wall 13 of the enclosure, various modified types of mountings may be employed preferably at the rear of the speaker either at the rear wall 17 or rear of the end wall or end cap 14. Further, it is not essential that the magnet structure of the cone or driver have its axis perpendicular to the entrance end 58 of the passage 50 although the bottom wall mounting as described has been found to be particularly effective. Additionally, as shown in FIG. 5, various modifications may be made in the interchangeable front panel section. Thus, in the modified form, a generally rectangular front panel section 70 has top and bottom walls 71 and 72, respectively, terminating in grooves 30'. As in the preferred form, the grooves are intended to interfit with ribs 31' at the front edges of the top and bottom walls 12' and 13', respectively. Specifically, in the modified form, the entire front panel section may be covered by a conventional form of grille cloth 74 which is inserted into grooves 75 in the top and bottom walls 71 and 72.

It is therefore to be understood that the foregoing and other modifications and changes may be made in the construction and arrangement of elements comprising the preferred form of present invention without departing from the spirit and scope thereof.

I claim:

1. A modular loudspeaker cabinet comprising an elongated enclosure having a plurality of external walls, a woofer for generating sound over a predetermined frequency range mounted internally of said enclosure in one wall thereof in facing, open communication with an opening in said one wall of said enclosure, and an outlet sound port positioned in spaced relation to said driver element in another wall of said enclosure remote from said woofer, baffles extending in equally spaced parallel relation to one another within said enclosure to divide said enclosure into a plurality of communicating folded tubular passage sections extending from open communication with said woofer internally of said enclosure to terminate in said sound outlet port; and a heat sink provided between said woofer and said outlet port whereby air pulses generated by said woofer will cool said heat sink.

2. A modular loudspeaker cabinet according to claim 1, said heat sink having a metal plate defining a wall of said passage sections.

3. A modular loudspeaker cabinet according to claim 2, said heat sink defining a front wall of said passage section communicating with said outlet port whereby air pulses generated by said driver element will cool said heat sink.

4. A modular loudspeaker cabinet according to claim 3, including a front panel and means releasably interconnecting said front panel to said cabinet along one side of said heat sink opposite to said woofer.

5. A modular loudspeaker cabinet according to claim 4, said enclosure having spaced parallel top and bottom walls, and said releasable connecting means defined by complementary ribs and grooves between said front panel and said top and bottom walls of said cabinet, said ribs and grooves being slidably engageable for endwise insertion of said front panel into coextensive relation to said top and bottom walls, and said cabinet having opposite end walls at opposite ends of said enclosure.

6. A modular loudspeaker cabinet according to claim 5, said front panel including rearwardly extending top and bottom wall portions alignable with said top and bottom walls of said cabinet and said complementary ribs and grooves interposed between the respective top and bottom walls of said cabinet and said front panel.

7. A modular loudspeaker cabinet according to claim 6, said front panel including midrange and tweeter speakers mounted thereon.

8. In a loudspeaker cabinet comprising an elongated enclosure having a plurality of external walls, a driver element for generating air pulses mounted in one of said walls and in communication with an opening in said one wall of said enclosure, and an outlet sound port is positioned in spaced relation to said driver element in another of said walls of said enclosure, the improvement comprising:

a plurality of baffle members extending in equally spaced, parallel relation to one another within said enclosure to define an audio transmission passage having a plurality of communicating, folded tubular passage sections with one end of said passage sections in direct communication with air pulses generated by said driver element and an opposite end of said passage sections in communication with said outlet sound port, and a heat sink extending in spaced parallel relation to said baffle members at the opposite end of said passage sections whereby air pulses generated by said driver element are operative to cool said heat sink.

9. In a loudspeaker cabinet according to claim 8, said transmission passage extending a substantial length of said enclosure, and said driver element being disposed at one end of said enclosure.

10. In a loudspeaker cabinet according to claim 8, said one wall defining a bottom wall of said enclosure at one end thereof, and said sound port disposed in said other wall at an end of said enclosure opposite to said driver element.

11. In a loudspeaker cabinet according to claim 8, said other wall defining an end wall of said enclosure opposite to said one end of said enclosure and at right angles to said bottom wall.

12. In a loudspeaker cabinet according to claim 8, said passage having a substantially uniform cross-sectional area along a length, a total length of a said passage to a cross-sectional area of said passage being proportional to prevent phase shifts of the air pulses generated by said driver element in a lower frequency range of 16 Hz to 100 Hz.

13. In a loudspeaker cabinet comprising an elongated enclosure having a plurality of external walls, a driver element for generating air pulses mounted in one of said walls and in communication with an opening in said one wall of said enclosure, and an outlet sound port is positioned in spaced relation to said driver element in another of said walls of said enclosure, the improvement comprising:

said enclosure being of generally rectangular configuration having spaced parallel top and bottom walls, opposite end walls and front and rear walls, said driver element positioned in facing relation to said bottom wall at one end of said enclosure and said sound port disposed in one of said end walls at an opposite end of said enclosure to said driver element; and a plurality of baffle members extending in equally spaced, parallel relation to one another within said enclosure to define an audio transmission passage having a plurality of communicating, folded tubular passage sections with one end of said passage sections in direct communication with air pulses generated by said driver element and an opposite end of said passage sections in communication with said outlet sound port, including a heat sink interposed between said front wall and said audio transmission passage whereby air pulses generated by said driver element are operative to cool said heat sink, and a chamfered bend in spaced facing relation to one end of said baffles intermediately of said audio transmission passage to cooperate with each baffle member in forming said audio transmission passage of a substantially uniform cross-sectional area.

14. In a loudspeaker cabinet according to claim 13, said driver element being a woofer and said front wall including midrange and tweeter speakers mounted thereon.

15. In a loudspeaker cabinet according to claim 13, said front wall being interchangeably mounted with respect to said enclosure.

16. In a loudspeaker cabinet according to claim 13, said baffles extending between said top and bottom walls to define generally rectangular passage sections.

17. In a loudspeaker according to claim 16, said baffles having polished wall surfaces.

* * * * *